(12) United States Patent
Dudar et al.

(10) Patent No.: US 10,523,759 B2
(45) Date of Patent: Dec. 31, 2019

(54) DETERMINING INFRASTRUCTURE LAMP STATUS USING A VEHICLE

(71) Applicant: Ford Global Technologies, LLC, Dearborn, MI (US)

(72) Inventors: Aed M. Dudar, Canton, MI (US); Kenneth James Miller, Canton, MI (US); Douglas Raymond Martin, Canton, MI (US)

(73) Assignee: Ford Global Technologies, Dearborn, MI (US)

( * ) Notice: Subject to any disclaimer, the term of this patent is extended or adjusted under 35 U.S.C. 154(b) by 293 days.

(21) Appl. No.: 15/607,358

(22) Filed: May 26, 2017

(65) Prior Publication Data

US 2018/0343303 A1 Nov. 29, 2018

(51) Int. Cl.
| | |
|---|---|
| *H04L 29/08* | (2006.01) |
| *H01L 31/04* | (2014.01) |
| *G01R 31/44* | (2006.01) |
| *H05B 37/03* | (2006.01) |
| *G01J 1/42* | (2006.01) |

(52) U.S. Cl.
CPC .............. *H04L 67/12* (2013.01); *G01R 31/44* (2013.01); *H01L 31/04* (2013.01); *H05B 37/03* (2013.01); *G01J 2001/4247* (2013.01)

(58) Field of Classification Search
CPC ......... H04L 67/00; H04L 67/12; H01L 31/00; H01L 31/04; H05B 37/00; H05B 37/03; H05B 37/032; H05B 37/034; H05B 37/036; H05B 37/038; H05B 37/04; H05B 39/105; H05B 41/2855; H05B 41/2858; H05B 41/292; H05B 41/2925; H05B 41/2928; H05B 41/298; H05B 41/2985; H05B 41/2988; H05B 41/46; G01R 31/00;
(Continued)

(56) References Cited

U.S. PATENT DOCUMENTS

| | | | |
|---|---|---|---|
| 8,576,069 B2 | 11/2013 | Nadeem et al. | |
| 9,646,499 B1 | 5/2017 | Finlow-Bates et al. | |

(Continued)

FOREIGN PATENT DOCUMENTS

| | | |
|---|---|---|
| CN | 202143276 U | 2/2012 |
| CN | 103901876 A | 7/2014 |

(Continued)

OTHER PUBLICATIONS

Elejoste et al., "An Easy to Deploy Street Light Control System Based on Wireless Communication and LED Technology", Sensors (Basel), May 2013; 13(5): 6492-6523 (published on line May 16, 2013), https://www.ncbi.nlm.nih.gov/pmc/articles/PMC3690067/.

(Continued)

*Primary Examiner* — Hoai-An D. Nguyen
(74) *Attorney, Agent, or Firm* — Frank A. MacKenzie; Bejin Bieneman PLC

(57) ABSTRACT

A vehicle computer is disclosed that includes one or more processors and memory that stores instructions executable by the one or more processors. The computer may be programmed to: receive a light input from an array of photovoltaic cells carried by a vehicle; based on the light input, determine that an infrastructure lamp is in a degraded state or a failure state; and transmit a report to a backend system based on the determination.

20 Claims, 5 Drawing Sheets

(58) Field of Classification Search
CPC ..... G01R 31/44; G01J 1/00; G01J 1/42; G01J 2001/4247
USPC .......... 324/403, 414, 72, 76.11, 96, 97, 500, 324/512, 537, 555, 600, 602, 609
See application file for complete search history.

(56) References Cited

U.S. PATENT DOCUMENTS

| | | | |
|---|---|---|---|
| 2007/0263222 A1 | 11/2007 | Loveless | |
| 2008/0143493 A1* | 6/2008 | Nam | H05B 37/0272 340/12.32 |
| 2011/0095867 A1* | 4/2011 | Ahmad | G01D 4/004 340/10.1 |
| 2015/0173159 A1* | 6/2015 | Lin | G01W 1/00 315/120 |

FOREIGN PATENT DOCUMENTS

| | | |
|---|---|---|
| CN | 204335116 U | 5/2015 |
| CN | 105548916 A | 5/2016 |
| EP | 3141876 A1 | 3/2017 |
| GB | 2368905 A | 5/2002 |
| WO | 199003094 A1 | 3/1990 |
| WO | 2017001233 A1 | 1/2017 |

OTHER PUBLICATIONS

NEX-G Street Lighting/Solar Power and Renewable Energy, "Street Lighting—Architecture and Product Components", http://www.nex-genergy.co.uk/solar_street_lighting.htm.
GB Search Report dated Dec. 19, 2018 re GB Appl. No. 1808442.6.

\* cited by examiner

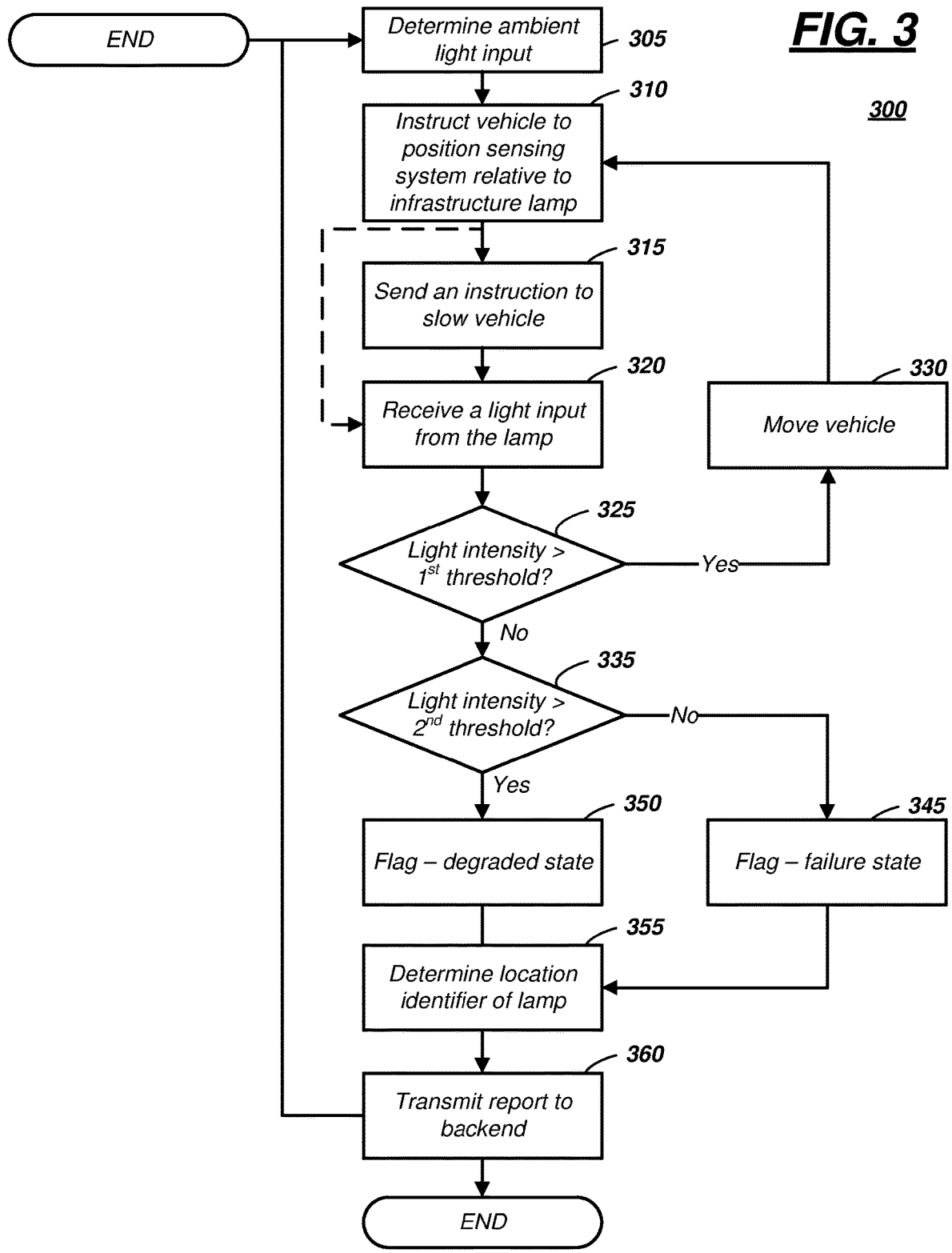

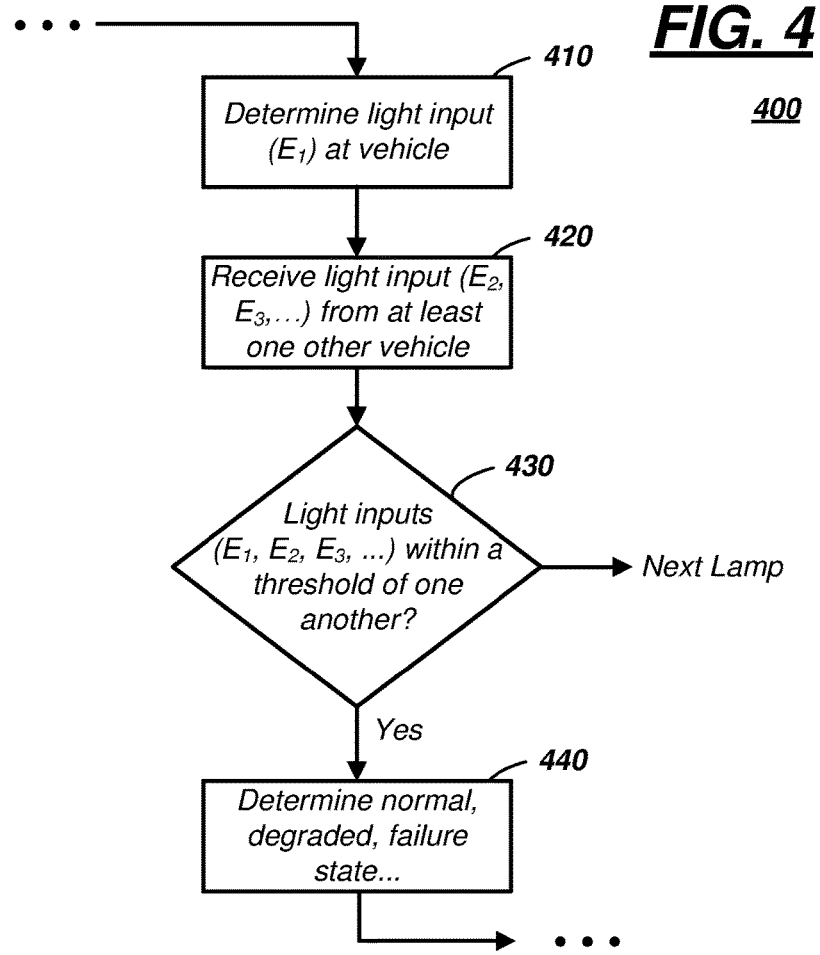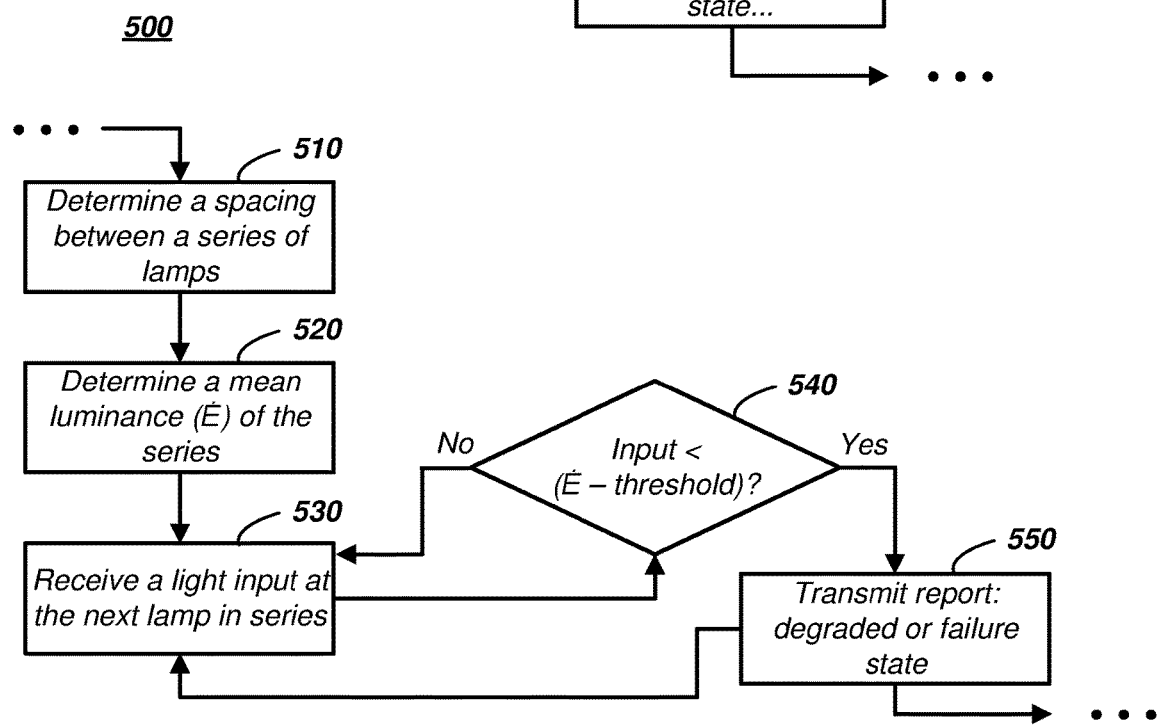

DETERMINING INFRASTRUCTURE LAMP STATUS USING A VEHICLE

BACKGROUND

Cities and states may hire or contract workers to drive from street-to-street checking whether street lamps are burnt out. For example, workers may respond to citizen phone complaints—e.g., that a lamp in front of their respective house is 'out.' And in some instances, police and/or fire departments make this determination—e.g., and also may take corrective action.

BRIEF DESCRIPTION OF THE DRAWINGS

FIGS. 3-5 are flow diagrams illustrating several illustrative processes of determining a status of an infrastructure lamp.

DETAILED DESCRIPTION

Figure 1:
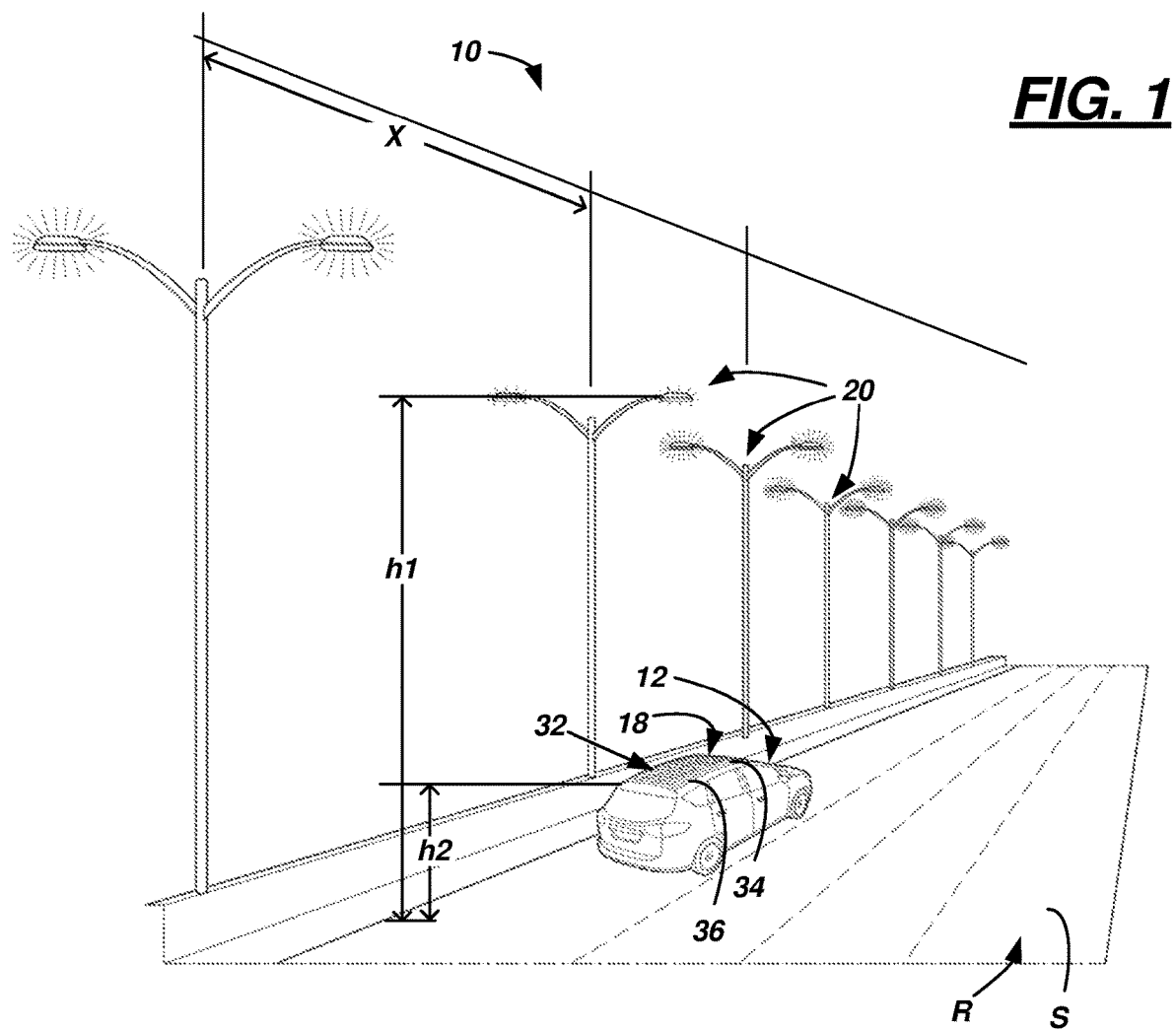
FIG. 1 is a perspective view of a vehicle on a roadway that has a plurality of infrastructure lamps.

An infrastructure status reporting system is described that includes a backend system and one or more vehicles, each having a computer and a sensing system which together can be used to determine a status of one or more infrastructure lamps. According to one illustrative example, the computer may be programmed to: receive a light input from an array of photovoltaic cells carried by a vehicle; based on the light input, determine that an infrastructure lamp is in a degraded state or a failure state; and transmit a report to a backend system based on the determination.

According to the at least one example set forth above, the array is located on a roof of the vehicle.

According to the at least one example set forth above, the array is coupled to a vehicle power bus to provide electrical power to the vehicle.

According to the at least one example set forth above, the computer further can be programmed to: determine that the lamp is in the degraded state based on an intensity of the light input being less than a first threshold and greater than a second threshold; and determine that the lamp is in the failure state based on an intensity of the light input being less than the second threshold.

According to the at least one example set forth above, the computer further can be programmed to instruct the vehicle to slow down prior to receiving the light input from the lamp.

According to the at least one example set forth above, the lamp may be positioned and oriented to illuminate a path or roadway for moving vehicles, positioned and oriented to illuminate a pedestrian walkway or sidewalk, or positioned and oriented to illuminate a vehicle parking region.

According to the at least one example set forth above, the report may include an identifier of the lamp and an indication of the degraded or failure state.

According to the at least one example set forth above, the report includes location data associated with the lamp.

According to the at least one example set forth above, the computer further is programmed to receive an identifier wirelessly from the lamp.

According to the at least one example set forth above, the computer further may be programmed to receive wirelessly: data from the lamp that is associated with a height (h1) of a light source of the lamp relative to a roadway surface, data from the lamp associated with a beam pattern of the light source, or a combination thereof.

According to the at least one example set forth above, the computer further may be programmed to receive wirelessly light inputs associated with the lamp from one or more additional vehicles, wherein the vehicle and the one or more additional vehicles are part of a platoon of vehicles.

According to the at least one example set forth above, the computer further may be programmed to determine whether the lamp is in a normal state, the degraded state, or a failure state based on the light inputs associated with each of the vehicles in the platoon.

According to the at least one example set forth above, the computer further may be programmed to determine a local brown-out or black-out condition based on the light inputs from a series of lamps spaced from one another along a roadway.

According to the at least one example set forth above, the computer further may be programmed to determine the degraded state or the failure state of at least one of a series of lamps based on the light inputs of the at least one lamp in the series compared with the light inputs of the series of lamps.

According to the at least one example set forth above, the vehicle includes one of a passenger vehicle, truck, freight vehicle, sports utility vehicle, recreational vehicle, bus, train, marine vessel, aircraft, or drone.

According to another illustrative example, a system includes the computer described above and the array of photovoltaic cells electrically coupled to the computer.

According to another illustrative example, a system includes a plurality of vehicles each having a light-sensitive sensing system, and a server computer programmed to: receive messages from the plurality of vehicles that includes location data and a status of an infrastructure lamp; and based on the messages, determine that the infrastructure lamp is in one of a normal state, a degraded state, or a failure state.

According to the at least one example set forth above, the server computer further may be programmed to determine a confidence level associated with the determined normal, degraded, or failure state.

According to the at least one example set forth above, the server computer further may be programmed to update localization data based on the messages.

According to another illustrative example, a method includes: receiving a light input from an array of photovoltaic cells carried by a vehicle; based on the light input, determining that an infrastructure lamp is in a degraded state or a failure state; and transmitting a report to a backend system based on the determination.

According to the at least one example, a computer is disclosed that is programmed to execute any combination of the instruction examples set forth above.

According to the at least one example, a computer is disclosed that is programmed to execute any combination of the examples of the method examples set forth above.

According to the at least one example, a computer program product is disclosed that includes a computer readable medium storing instructions executable by a computer processor, wherein the instructions include any combination of the instruction examples set forth above.

According to the at least one example, a computer program product is disclosed that includes a computer readable medium that stores instructions executable by a computer processor, wherein the instructions include any combination of the examples of the method examples set forth above.

Figure 2:
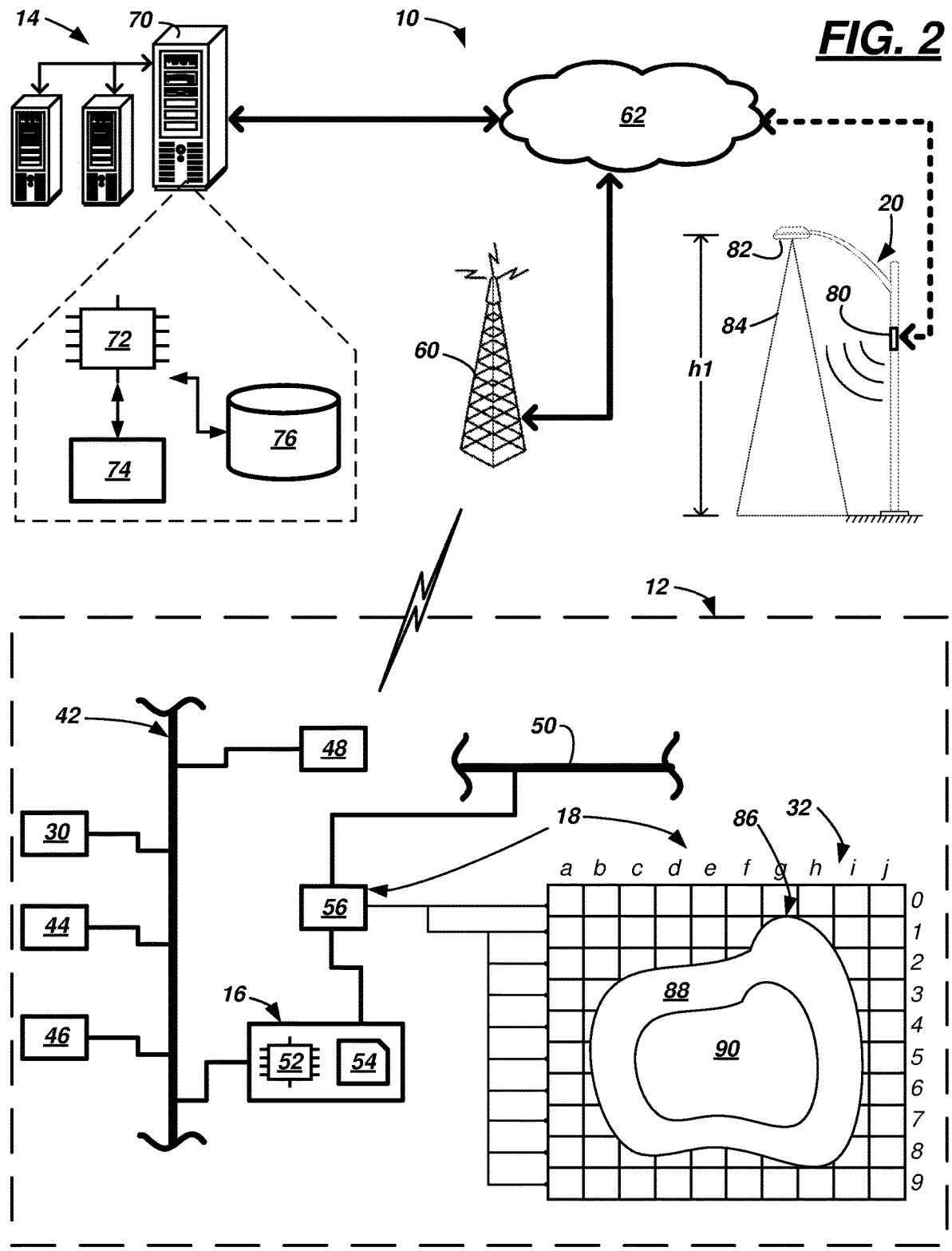
FIG. 2 is a schematic view of an infrastructure status reporting system that includes the vehicle of FIG. 1.

Now turning to the figures, wherein like numerals indicate like parts throughout the several views, there is shown an infrastructure status reporting system 10 that includes one or more vehicles 12 (e.g., only one is shown) and a backend system 14 in communication with the one or more vehicles 12. The one or more vehicles 12 may be similar or even identical; therefore, only one will be described herein (however, it should be appreciated that many like vehicles may be used in the reporting system 10). As shown in FIGS. 1 and 2, vehicle 12 may comprise an onboard computer 16 and at least one light-sensitive sensing system 18 coupled to the computer 16, wherein the sensing system 18 is suitable for detecting the light intensity of roadway infrastructure lamp 20 (e.g., such as a roadside or overhead lamp, a parking garage lamp, or the like). Using the sensing system 18, computer 16 can determine whether infrastructure lamps and other such illumination devices are in a normal state (providing an expected luminance), a failure state (providing no luminance), and/or a degraded state (providing a portion of the expected luminance). Then, e.g., vehicle computer 16 may report which lamps are in a degraded and/or failure state to the backend system 14—which in turn, may facilitate the repair or replacement thereof. According to one aspect of the system 10, the vehicles 12 which may be moving from point-to-point may be a participant in the so-called Internet-of-Things (IOT)—e.g., providing a service to the local, state, federal, etc., communities. For instance, the infrastructure status reporting system 10 may be used while the vehicles 12 and/or backend system 14 perform other tasks. Further, in at least some examples, vehicles 12 are autonomous taxi vehicles—e.g., and may be programmed to detect and report the degraded and/or failure states of infrastructure lamps during periods where the respective vehicles are not performing occupant transport services, as will be explained more below.

Vehicle 12 is shown as a passenger car; however, vehicle 12 could also be a truck, freight vehicle, sports utility vehicle (SUV), recreational vehicle, bus, train, marine vessel, aircraft, drone, or the like that includes the infrastructure status reporting system 10. Vehicle 12 may be operated in any one of a number of autonomous modes. In at least one example, vehicle 12 may operate as an autonomous taxi or the like—e.g., operating in a fully autonomous mode (e.g., a level 5), as defined by the Society of Automotive Engineers (SAE) (which has defined operation at levels 0-5). For example, at levels 0-2, a human driver monitors or controls the majority of the driving tasks, often with no help from the vehicle 12. For example, at level 0 ("no automation"), a human driver is responsible for all vehicle operations. At level 1 ("driver assistance"), the vehicle 12 sometimes assists with steering, acceleration, or braking, but the driver is still responsible for the vast majority of the vehicle control. At level 2 ("partial automation"), the vehicle 12 can control steering, acceleration, and braking under certain circumstances without human interaction. At levels 3-5, the vehicle 12 assumes more driving-related tasks. At level 3 ("conditional automation"), the vehicle 12 can handle steering, acceleration, and braking under certain circumstances, as well as monitoring of the driving environment. Level 3 may require the driver to intervene occasionally, however. At level 4 ("high automation"), the vehicle 12 can handle the same tasks as at level 3 but without relying on the driver to intervene in certain driving modes. At level 5 ("full automation"), the vehicle 12 can handle all tasks without any driver intervention.

For example, in order to carry out such autonomous driving tasks, vehicle 12 may have numerous computing systems including a powertrain control system 30 (see FIG. 2). The powertrain control system 30 may comprise a vehicle motor (not shown), a transmission (not shown), and a steering system (not shown), among other things. The motor may comprise a combustion engine, an electric motor, a hybrid electric motor or the like. In one example (and as described more below), vehicle 12 is a hybrid electric, fully-electric, or solar-powered vehicle—e.g., utilizing an array of photovoltaic (PV) cells 32 to scavenge electrical power from sunlight and/or artificial light sources (see e.g., the array 32 shown in FIG. 1 on an exterior surface 34 of a vehicle roof 36). Regardless of the type of vehicle motor, when actuated and engaged, the system 30 may move and steer the vehicle using the transmission and steering system, respectively. In general, the powertrain control system 30, its assembly and construction, and the techniques for controlling it via a human- or computer-operator will be appreciated by skilled artisans.

The powertrain control system 30 may be coupled to computer 16 via any suitable wired and/or wireless network connection 42. In at least one example, the connection 42 includes one or more of a controller area network (CAN) bus, Ethernet, Local Interconnect Network (LIN), a fiber optic connection, a local wireless connection, or the like. Other examples also exist. For example, alternatively or in combination with e.g., a CAN bus, connection 42 could comprise one or more discrete wired or wireless connections.

According to at least the illustrated example, network connection 42 communicatively couples the powertrain control system 30 to: the computer 16, a positioning system 44, a vision system 46, and a wireless communication module 48. Computer 16 may be a single computing device or multiple computing devices (e.g., shared with other vehicle systems and/or subsystems). In at least one example, computer 16 is a power management module—e.g., for controlling power available to modules in vehicle 12 via a vehicle power bus 50 (e.g., which provides 12V, 24V, etc. power); however, this is merely an example. Computer 16 may comprise one or more processors or processing circuits 52 coupled to memory 54. For example, processor(s) 52 can be any type of device capable of processing electronic instructions, non-limiting examples including a microprocessor, a microcontroller or controller, an application specific integrated circuit (ASIC), etc.—just to name a few. In general, computer 16 may be programmed to execute digitally-stored instructions, which may be stored in memory 54, which enable the computer 16 (e.g., more specifically processor 52), among other things, to: determine a luminance state of an infrastructure lamp 20; when the luminance state is a failure or degraded, then generate a report that indicates the state of the lamp 20 and its location; and provide that report to the backend system 14. The computer 16 also may be programmed to provide the report only when the computer has a predetermined confidence level; e.g., as will be explained more below, an increase in confidence level may be a result of multiple parameters indicating a similar conclusion (i.e., multiple parameters indicating a luminance failure or degradation).

Memory 54 may include any non-transitory computer usable or readable medium, which may include one or more storage devices or articles. Exemplary non-transitory computer usable storage devices include conventional computer system RAM (random access memory), ROM (read only memory), EPROM (erasable, programmable ROM), EEPROM (electrically erasable, programmable ROM), as well as any other volatile or non-volatile media. Non-volatile media include, for example, optical or magnetic disks and other persistent memory. Volatile media include dynamic random access memory (DRAM), which typically constitutes a main memory. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, an EPROM, a FLASH-EEPROM, any other memory chip or cartridge, or any other medium from which a computer can read. As discussed above, memory 54 may store one or more computer program products which may be embodied as software, firmware, or the like.

Sensing system 18 which may be coupled to computer 16, may include a local controller 56 coupled to an array of light-sensitive sensors 32. The local controller 56 may comprise a processor (not shown) and memory (not shown)—here, processor and memory of controller 56 may have similar features as processor 52 and memory 54; however, local controller processor may carry out different instructions than that of processor 52; i.e., controller memory may store different executable instructions. For example, the local controller 56 may be programmed to receive an indication of light intensity from sensors 32 and provide this data to computer 16. Further, in at least some examples, controller 56 may control the flow of electrical charge received by the sensors 32 to the vehicle power bus 50. Sensors 32 should be broadly construed to include one or more electronic devices which sense light intensity and provide an output based on the received light intensity—these sensors may be solar cells, but this is not required.

As discussed above, in one non-limiting example, sensors 32 are photovoltaic (PV) cells which include one or more photoactive layers and a transducer (e.g., to convert light energy to electrical charge). For example, as used herein, a photovoltaic (PV) cell is an electrical device that converts light energy into electricity according to the photovoltaic effect, wherein electrical parameters of the cell (e.g., such as current, voltage, resistance, etc.) vary when exposed to light. A plurality of PV cells may be adjacently-located on any suitable surface 34 to form a solar panel e.g., such as the illustrated array 32. FIG. 2 illustrates a simplified schematic of PV cells 32 (e.g., arranged in an array having columns a-j and rows 0-9). In this example, each cell (e.g., such as cell g-1) may provide a range of electrical outputs in the presence of light energy. For example, the cell may trigger a predetermined electrical output (e.g., current, voltage, resistance, etc.) when the light intensity is greater than a predetermined threshold (e.g., the range of electrical outputs may be ON or OFF). Or, for example, the cell may trigger a predetermined electrical output (e.g., current, voltage, resistance, etc.) based on varying degrees of light intensity; e.g., the range could indicate OFF, 25% ON, 50%, 75% ON, or fully ON, based on different received light intensities. According to one non-limiting example, the electrical output is a mathematical function of the received light intensity (e.g., a curve). In at least one example, when the light intensity at a particular PV cell 32 reaches a predetermined threshold, the cell 32 may be in a saturated state—e.g., for light intensities above a threshold, the cell may no longer output correspondingly larger electrical outputs.

The sensing system 18 may comprise one or more intermediary storage cells or batteries (not shown)—e.g., which store power temporarily, until the power can be delivered to the bus 50. Similarly, computer 16 may be programmed to trigger local controller 56 to cause the controller 56 to deliver all or some power to bus 50. Thus, in at least some examples, controller 56 may be programmed as a client computer with respect to computer 16.

Positioning system 44 may be any suitable electronic computing device coupled to network connection 42 which can provide global and/or local location data to computer 16. For example, positioning system 44 may receive location data (e.g., such as latitude and longitude (LAT/LONG) coordinate data) from one or more satellites. Non-limiting satellite types and location systems include GPS (global positioning system) and GLONASS (global navigation satellite system). As will be described more below, positioning system 44 may be used to provide location data (to the backend system 14), wherein the location data is associated with a lamp 20 identified by vehicle 12 needing repair or replacement.

Vision system 46 can comprise one or more imaging or observation devices, one or image processing computers, software, and the like. Non-limiting examples of imaging or observation devices include laser identification detection and ranging (LIDAR) devices, radio detection and ranging (RADAR) devices, and/or day cameras (e.g., complementary metal oxide semiconductor (CMOS) devices, charge-coupled devices (CCDs), image intensifiers (so-called i-squared or light-amplification devices), etc.), just to name a few examples. Vision system 46 may use a single imaging or observation device or any suitable combination of devices to, among other things, receive data regarding the relative position(s) of other roadway vehicles for autonomous driving control. In at least one example, in addition to supporting autonomous driving modes, vision system 46 may be used to identify infrastructure lamps 20 which the vehicle 12 is approaching. In at least one example, the sensing system 18 is one of the observation devices of vision system 46—e.g., thus, the lamp degradation or failure could be detected by the vision system 46. In other examples, sensing system 18 operates independent of vision system 46. Accordingly, in at least one example, the vision system 46 provides, to computer 16, data regarding infrastructure lamps 20 within a proximity of vehicle 12 (e.g., via network connection 42).

Wireless communication module 48 may be any suitable telematics computing device assembled to wirelessly communicate with other electronic devices (e.g., vis one or more wireless communication and/or land communication networks 60, 62, such as those described below). Such wireless telecommunication may include use of cellular technology (e.g., LTE, GSM, CDMA, and/or other cellular communication protocols), short range wireless communication technology (e.g., using Wi-Fi, Bluetooth, Bluetooth Low Energy (BLE), dedicated short range communication (DSRC), and/or other short range wireless communication protocols), or a combination thereof. Such communication includes so-called vehicle-to-vehicle (V2V) and vehicle-to-infrastructure (V2I) communications as well—all of which will be appreciated by those skilled in the art. For example, module 48 may include an embedded cellular chipset or may facilitate cellular communication using the chipset of a mobile device (not shown) carried by a user of vehicle 12 (e.g., a cellular phone, Smart phone, etc.). According to at least some aspects, module 48 may be programmed to receive from onboard computer 16, via the connection 42, a wireless transmission instruction coupled with an infrastructure report, and based on receipt of the instruction and the request, wirelessly transmit the report to backend system 14.

FIG. 2 also illustrates other aspects of the infrastructure status reporting system 10; e.g., namely, the backend system 14, a wireless communication network 60, a land communication network 62, and a plurality of infrastructure lamps 20 (e.g., only one is shown for illustrative purposes). Backend system 14 includes one or more interconnected and remotely-located computer servers 70 (e.g., via a private network or the like). Several servers 70 are shown; however, as each of the server 70 can be similar or identical, only one will be described.

Servers 70 may perform a number of backend functions for vehicles (e.g., such as vehicle 12, which may be operating in one or more autonomous and/or non-autonomous driving modes). Non-limiting examples of backend functions include providing infrastructure report data to third-party entities and/or to federal and/or local governments and municipalities, as well as providing to vehicles 12: infotainment and/or entertainment services, emergency services, routing and/or destination data, etc. In another example, server 70 is owned by the government (e.g., owned by a department of transportation). Server 70 may comprise one or more processors 72, memory 74, and one or more databases 76. Processor(s) 72 and memory 74 of server(s) 70 may have similar features and/or functions as processor 52 and memory 54; however, processor(s) 72 may carry out different instructions than that of processor 52; similarly, memory 74 may store different instructions, and processor(s) 72 may execute these different instructions. According to one non-limiting example, memory 74 may store instructions executable by processor(s) 72 that include: receiving multiple infrastructure reports from a plurality of vehicles 12, determining from one or more of the reports that an infrastructure lamp requires repair or replacement, determining location data associated with the respective lamp 20, and providing an indication to an authorized service technician or service entity so that the technician or entity may facilitate the repair and/or replacement of the lamp. These are merely illustrative instructions; other instructions may be stored and executed as well (including combinations that include one or more of the instructions cited above). For example, server(s) 70 may determine a confidence level associated with respective infrastructure lamp 20 in need of repair or replacement (e.g., a probability or likelihood that repair/replacement is needed). In at least one example, server(s) 70 may not issue the indication to the authorized service technician or entity unless the confidence level is greater than a predetermined threshold.

Database(s) 76 at backend system 14 may store, among other things, collections of digital map files in a filing system. For example, one or more databases 76 may be dedicated to storing infrastructure and map data associated with a metropolitan or urban macro-region classified as a so-called Level 4 autonomous driving region—e.g., so-called localization data. Skilled artisans will appreciate that vehicle operating in an autonomous mode may use such localization data to drive from point-to-point, stay within a respective traffic lane, turn, avoid obstacles as well as other vehicles, etc. Localization data files in the databases 76 may be checked out or downloaded, updated using processor(s) 72 (e.g., identifying infrastructure lamps 20 which are operating in a normal state, as well as those lamps 20 operating in a degraded or failure state). Thereafter, data files may be uploaded and stored within the database(s) 76 again (e.g., including following when repair or replacement occurs of a light source within the respective lamp 20).

As discussed above, vehicles 12 may communicate with the backend system 14 via their respective wireless communication module 48 and via the wireless and/or land communication networks 60, 62. Land communication network 62 can enable connectivity to public switched telephone network (PSTN) such as that used to provide hard-wired telephony, packet-switched data communications, internet infrastructure, and the like. And wireless communication network 60 may include satellite communication architecture, cellular telephone communication over wide geographic region(s), and/or short-range wireless communication over shorter geographic regions. Thus, in at least one example, network 60 includes any suitable cellular infrastructure (e.g., including LTE, CDMA, GSM, etc.) that could include eNodeBs, serving gateways, base station transceivers, and the like. Further, network 60 may utilize short range protocols, technologies, etc. such as, but not limited to: Wi-Fi, Wi-Fi Direct, Bluetooth, BLE, Dedicated Short Range Communication (DSRC), etc. Collectively, or individually, networks 60, 62 may be part of a vehicle-to-vehicle (V2V) or vehicle-to-infrastructure (V2I) network. Wireless and land communication networks 60, 62 are generally known in the art and will not be described further herein.

Infrastructure lamps 20 may be used illuminate paths, roads, walkways, etc. used primarily by vehicles 12, but also pedestrians, cyclists, etc. As used herein, infrastructure lamps 20 include: any lamps on a fixed mount that are positioned and oriented to illuminate a path or roadway for moving vehicles 12, any lamps on a fixed mount that are positioned and oriented to illuminate a pedestrian walkway or sidewalk adjacent the vehicle path or roadway, and any lamps on a fixed mount that are positioned and oriented to illuminate a vehicle parking region (e.g., a parking lot or garage, vehicle service station (such as e.g., a filling station, repair station, etc.)). The fixed mount(s) may be attached to the ground (earth), to buildings, to walls, to brackets, or other fixed structures. Thus, while a street lamp is illustrated in FIGS. 1-2, this is merely one example.

According to one example, the infrastructure lamps 20 are so-called Smart lamps—i.e., they include a computer module 80 that includes a processor, memory, wireless transceiver, etc. Such Smart lamps may communicate data wirelessly via its transceiver to nearby similarly-connected devices—e.g., such as vehicle 12 (e.g., via module 48) (or they may even be connected by wire to the land communication network 62). In some instances, the lamp 20 may transmit a beacon signal indicating its presence and capability of providing data (e.g., IOT data). According to one non-limiting example, the module 80 can transmit one or more of the following via the computer module 80: an identifier, a status of the lamp 20, and one or more lamp parameters. The identifier may include a make and/or model value, a serial number, GPS coordinates, etc. that uniquely identifiers the lamp 20 itself, a type of lamp, and/or its geographic location. The status of the lamp 20 may include whether the lamp 20 is in a normal state, a degraded state, or a failure state. For example, the lamp 20, via module 80, may be self-diagnosing—e.g., knowing that a light source 82 thereof is degraded or has failed. Lamp parameters may include features and/or functions associated with the particular lamp 20—non-limiting examples include: a light intensity parameter (lux) at the source 82, a beam shape parameter (e.g., indicating a volume or shape 84 of light emitted from source 82, a height (h1) of the light source 82 (e.g., relative to a surface S of roadway R; FIGS. 1-2), a beam pattern parameter at a specified distance from the source 82, or the like—e.g., just to name a few examples. An exemplary beam pattern 86 is shown in FIG. 2 (e.g., overlaying the example array 32). This pattern 86 may include varying regions of intensity—e.g., such as an outer region 88 and an inner region 90. This is merely one example, wherein the inner region 90 has greater light intensity from source 82 than does the outer region 88 (note: while two regions 88, 90 having different intensities are shown, more or less may be observed using array 32). According to one example, a lamp identifier and at least one beam parameter could be received at vehicle 12; the computer 16 may determine the type of lamp, as well as its location data based on the identifier; the received beam parameter may be scaled by computer 16 (e.g., accounting for a vehicle height (h2)—e.g., if the array 32 is located on vehicle roof 36); using computer 16, the received beam pattern may be compared to a stored beam pattern retrieved from memory 54 (e.g., which would indicate a normal state of lamp 20); and then, computer 16 may determine whether the received beam pattern indicates a normal state, a degraded state, or a failure state. In the normal state, computer 16 may determine an expected intensity based on the beam pattern. In the failure state, no distinguishable pattern may be determined by computer 16. In the degraded state, the intensity (e.g., of region 88, region 90, or both) may be less than one or more predetermined thresholds. The lamp 20 and parameters illustrated here are merely examples. Further, as discussed above, lamps 20 may not be Smart lamps as well.

Turning now to FIG. 3, a process 300 is described illustrating one way of determining a lamp status at vehicle 12. Process 300 begins with block 305—wherein computer 16 receives an ambient light input from sensing system 18 (e.g., via array 32). In one example, computer 16 determines the ambient light input when the vehicle 12 is located between two or more infrastructure lamps 20. In other examples (e.g., in city scenarios), computer 16 averages the ambient light input over a predetermined interval of time—e.g., when the vehicle 12 is not located within a predetermined radius of a lamp 20 (e.g., more than 20 feet away). In other examples, computer 16 receives (e.g., from backend system 14 or via the internet) a sunset and sunrise data, moon data, weather data, and the like, determines the lighting conditions based at least in part of the sunrise, sunset, moon, and/or weather data. Of course, computer 16 could determine ambient lighting conditions in other ways as well.

Following block 305, in block 310, computer 16 instructs the vehicle 12 to position the sensing system 18 relative to a nearby infrastructure lamp 20 (e.g., as exemplified in FIG. 1). Block 310 may include computer 16 determining a proximity of an infrastructure lamp 20 and sending an instruction to the powertrain control system 30, via network connection 42, to move the vehicle 12 toward the lamp 20. In other examples, vehicle 12 may determine that no re-direction of vehicle 12 toward the lamp 20 is required—i.e., the vehicle's present course may pass beneath lamp 20. Determining proximity and positioning the vehicle 12 beneath the lamp 20 may include any suitable process—e.g., including the use of localization data stored in computer memory 54 (e.g., or other memory), receiving data from vision system 46, receiving data from positioning system 44, using a beacon signal from lamp 20 (e.g., if a Smart lamp), etc. In at least one example, computer 16 instructs vehicle 12 to move below the lamp 20—e.g., inasmuch as is possible (e.g., accounting for pedestrian ways, cyclist ways, etc.).

In block 315 which follows, computer 16 optionally may instruct the vehicle 12 to slow down or even stop (e.g., at a point when downwardly-directed light from the lamp 20 is at its zenith with respect to the array 32). In this manner, array 32 may minimize environmental illumination noise (e.g., reflections, flashing or blinking lights, etc.) which may interfere with the sensing of light from lamp 20 and measurement by computer 16.

In block 320 which follows, computer 16, via sensing system 18, may receive a light input (e.g., the measurement) from the lamp 20. This light input may be stored in memory 54—e.g., in at least one example, the light input may be a beam pattern having regions of differing intensity (e.g., such as the one shown in FIG. 2).

In block 325, computer 16 may determine whether the light intensity of at least a portion of the light input (e.g., the beam pattern) is greater than a first threshold; one non-limiting example of a first threshold is 10 lux. (Alternatively, computer 16 may determine whether a predetermined quantity of PV cells 32 indicate a light intensity greater than the first threshold.) If computer 16 determines that at least a portion of the beam pattern is greater than the first threshold, then computer 16 may determine to not flag the particular lamp 20 (e.g., determining that the lamp 20 is operating in a normal state). In one example, computer 16 instructs powertrain control system 30 to move away from lamp 20 (block 330)—e.g., to cease pausing or slowing down, thereby permitting vehicle 12 to continue to monitor other lamps 20 or continue towards its destination.

If in block 325 computer 16 determines that no portion of the light input (e.g., beam pattern) is greater than the first threshold, then process 300 may proceed to block 335, and computer 16 may determine whether the light intensity of at least a portion of the light input (e.g., beam pattern) is greater than a second threshold; one non-limiting example of a second threshold is 3 lux. If. If computer 16 determines that no portion of the light input (e.g., beam pattern received in block 320) is greater than the second threshold, then computer 16 may flag or associate a failure state with the lamp 20 (block 345). For example, at least temporarily, computer 16 may store one or more identifiers associated with the lamp 20, as well as the failure state in memory 54. (Alternatively, computer 16 also could determine the failure state in block 345 if less than a predetermined quantity of PV cells 32 indicate a light intensity less than the second threshold; still other techniques may be employed.) Block 355 (described below) may follow block 345.

Returning to block 335, if computer 16 determines that at least a portion of the light input (e.g., at least a portion of the beam pattern) is greater than the second threshold—but that no portion of the beam pattern is greater than the first threshold (block 325)—then computer 16 may flag or associate a degraded state with the lamp 20 (block 350). For example, at least temporarily, computer 16 may store one or more identifiers associated with the lamp 20, as well as the degraded state in memory 54. (Similarly (and alternatively), computer 16 also could determine the degraded state in block 350 if less than a predetermined quantity of PV cells 32 indicated a light intensity greater than the second threshold.)

Following either block 345 or block 350, computer 16 may determine—if not already determined—location data of the respective lamp 20. For example, computer 16 may be programmed to store GPS coordinates of the lamp 20 or the like—e.g., using location data received from the positioning system 44. Or for example, location data may be provided to computer 16 by lamp 20 itself (e.g., if a Smart lamp)—e.g., via wireless communication module 48. Computer 16 may determine the location data associated with the lamp 20 in other ways as well.

In block 360 which follows, computer 16 may transmit a report or message to the backend system 14 indicating the flagged state of the respective lamp 20. This report may include an identifier and/or location data—which in at least one example may be the same. According to one example, the report includes a unique identifier of the lamp 20, and backend system 14 determines the location data using the identifier. Or for example, the report may comprise location data in the format of GPS coordinates—and the backend system 14 may associate the location data with a particular lamp 20. Other examples exist as well.

Once backend system 14 receives the report, system 14 may facilitate maintenance to address the state of the lamp 20—e.g., based on whether the lamp 20 is in a degraded or failure state. For example, system 14 may send a notification to authorized service personnel to travel to the lamp's location and repair or replace one or more lamp components. Further, those lamps having a failure state may be addressed with priority over those having a degraded state. Or for example, regions of higher pedestrian and/or vehicle traffic may be addressed first. These are merely examples.

Following block 360, process 300 may loop back to block 305 and repeat one or more of the blocks described above, or alternatively, process 300 may end. All or portions of the process 300 may repeat as many times as desired. Further, at least some of the blocks may be executed at least partially concurrently.

Other implementations also exist. For example, computer 16 may send a report to the backend system 14 indicating lamps 20 determined to be in the normal state as well.

FIG. 4 illustrates a process 400 that includes instructions which may be executable by computer 16 in combination with at least some of the blocks of process 300. According to one non-limiting example, process 400 pertains to a platoon of vehicles 12, wherein each of the vehicles 12 have a computer (e.g., like computer 16) and sensing system (e.g., like sensing system 18). One of the vehicles may be designated a platoon leader vehicle (12)—and blocks 410-440 may be carried out by the computer 16 of the platoon leader vehicle 12. As used herein, a platoon of vehicles is a plurality of vehicles moving together, wherein one of the vehicles is determining a speed and direction of other vehicles in the group. In one example, one vehicle leads a second vehicle, the second vehicle leads a third vehicle, the third vehicle leads a fourth vehicle, etc.

In block 410, when the leader vehicle 12 is located proximate to lamp 20, computer 16 may determine a first light input ($E_1$) using the sensing system 18, similar to the process described above. Then in block 420, via any suitable wireless communication protocol, the platoon vehicle 12 may receive light inputs ($E_2$, $E_3$, . . . ) from the other vehicles in the platoon. For example, the platoon of vehicles may communicate via DSRC or any other short or long range communication protocol. Thus, after each vehicle in the platoon receives a respective light input from the lamp 20, the leader vehicle 12 may receive light inputs therefrom ($E_2$, $E_3$, . . . )—e.g., receiving the inputs collectively or individually.

In block 430 which follows, computer 16 of the platoon leader vehicle 12 may determine whether each of the light inputs, including its own ($E_1$, $E_2$, $E_3$, . . . ), is within a threshold of one another. For example, the threshold may be a variance, standard deviation, or the like—just to name a couple non-limiting examples. If there is an outlier (e.g., a light input that is determined to be outside the threshold), then computer 16 may elect to not flag the lamp 20 as a normal, degraded, or failure state (e.g., the state may be considered indeterminate). In this instance, process 400 may proceed to another lamp and repeat.

However, if for example, computer 16 determines a concurrence (no light input outside the threshold) from among the light inputs associated with each of the platoon vehicles, then computer 16 appropriately may flag the particular lamp 20 in accordance with a normal state, a degraded state, or a failure state, as described above. A confidence level may be associated with lamps 20 from which multiple sensing system measurements have been determined. The confidence level may be a statistical probability; and lamps 20 having a degraded state or a failure state—associated with a confidence level greater than a threshold confidence level—may be determined to have a higher maintenance priority at backend system 14. Accordingly, backend system 14 address the maintenances of these lamps 20 first.

Figure 6:
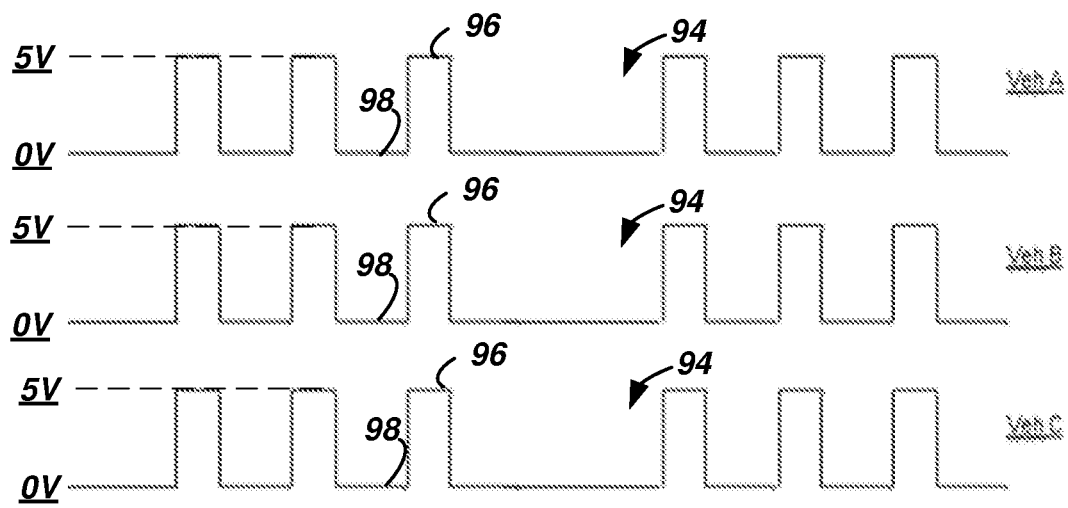
FIGS. 6-7 are exemplary graphical diagrams illustrating outputs of sensing systems of three different vehicles.
Figure 7:
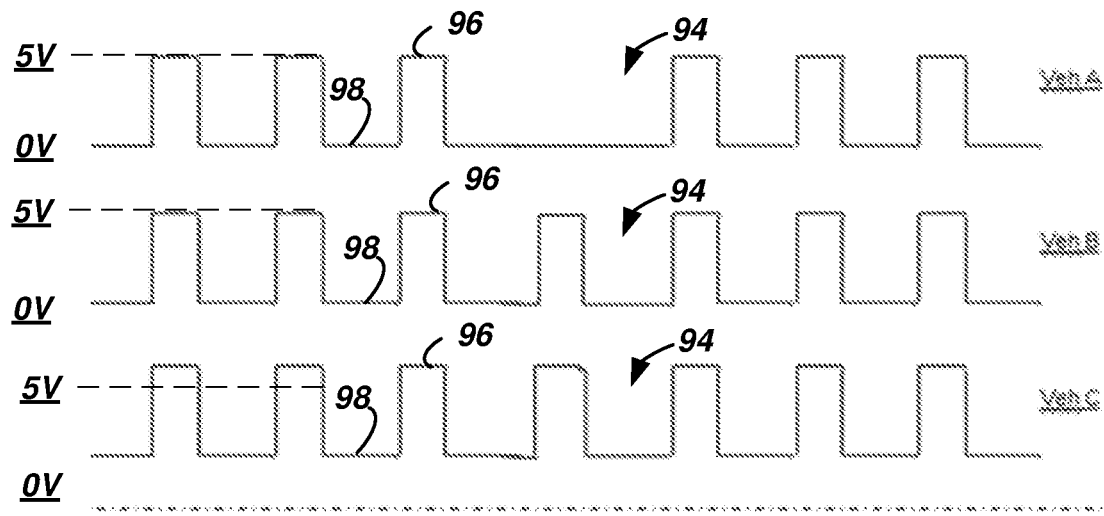

FIGS. 6 and 7 further illustrate a sequence 94 of light inputs received by three sample platoon vehicles A, B, C, wherein each 5V pulse 96 may represent infrastructure lamps 20 operating in the normal state, and the intervals 98 between the pulses 96 may represent time lapsed as the vehicles A, B, C travel at a constant rate past the series of lamps 20. In FIG. 6, a series of pulses 96 are shown for each of vehicles A, B, C; however, a fourth pulse in the sequence 94 is absent (e.g., 0V) indicating a light input that corresponds to a failure state. In at least one example, platoon leader vehicle 12 (e.g., which may or may not be one of the vehicles A, B, C) may determine with a threshold confidence level based on three vehicles A, B, C each determining that a corresponding lamp light input indicates the failure state.

FIG. 7 is similar to FIG. 6; however, in FIG. 7, only vehicle A determines the failure state at the fourth lamp (e.g., represented by the 0V pulse), whereas vehicles B and C determine that lamp 20 is operating in the normal state (e.g., represented by the corresponding 5V pulses). In this example, computer 16 of the platoon vehicle 12 may determine an indeterminate state based on the inconsistent determinations of vehicles A, B, C. Accordingly, platoon vehicle 12 may not report the lamp 20 which corresponds to the fourth pulse, as there may not be a threshold confidence level.

Alternatively, or in combination with platoon leader vehicle 12, process 400 may be carried by computer server 70 as well. For instance, server 70 may receive multiple reports from a plurality of vehicles 12 (which may or may not be located in a platoon). The reports may include a measurement of light input—e.g., received by each of the respective vehicles 12. And server 70 may carry out at least blocks 430 and 440—e.g., determining the state based on a variance, deviation, etc. Again, where more vehicles 12 have reported light inputs indicating a degraded or failure state, server 70 may determine the respective state according to a higher confidence level.

Process 500 may be carried out by vehicle 12 as well. Process 500 may be executed with all or part of processes 300 and/or 400. In block 510, computer 16 determines a uniform spacing X between a series of lamps 20 (e.g., such as the lamps 20 shown in FIG. 1). As vehicle 12 passes at least partially beneath each of the lamps 20 in the series, computer 16 may determine a corresponding light input, as described above (e.g., $E_1$, $E_2$, $E_3$, . . . ).

In block 520, computer 16 may determine an average or mean luminance ($Ė$) of the light inputs in the series of lamps 20. For example, if light inputs for twenty lamps are received via sensing system 18, computer 16 may calculate $\dot{E}=(E_1+E_2+E_3+, \ldots, +E_{20})/20$. Of course, more or fewer quantities of lamps 20 may be used. According to one example, this average may determine a baseline value, wherein the degraded state or failure state of other lamps 20 may be determined based on the mean ($\dot{E}$). For example, the degraded state may be a threshold amount less than the baseline (e.g., 25% less or the like). Similarly, the failure state also may be another threshold amount less than the baseline (e.g., 50% less or the like).

In block 530, computer 16 may receive a light input from another lamp in the series (e.g., $E_{21}$). The next lamp in the series (e.g., $E_{21}$) may be determined by vehicle 12 moving a distance X along roadway R, using positioning system 44, using vision system 46, or any combination thereof.

In block 540, computer 16 may determine whether the next light input (e.g., $E_{21}$) is less than the value of the mean less a predetermined threshold ($\dot{E}$—threshold). If it is not, then computer 16 may repeat block 530 with respect to the next lamp in the series (e.g., $E_{22}$). However, if the light input (of e.g., $E_{21}$) is determined by computer 16 to be less than $\dot{E}$-threshold, then computer 16 may transmit a report to the backend system 14 indicating a degraded or failure state. The degraded or failure state may be determined in any suitable manner, including according to the examples set forth above.

Following block 550, process 500 may loop back and repeat block 530 as many times as suitable. Process 500 may be used to determine a local brown-out condition—e.g., when power provided to a power grid decreases at least locally. In such conditions, were the computer 16 to determine the normal, degraded, and/or failure state of each lamp 20 in a series based on predetermined light intensity values, the computer 16 inaccurately may report a series of degradations or failures. However, as described above, when the computer 16 determines a luminance or intensity average of a series of lamps 20, all lamps operating normally (e.g., but for the brown-out condition) may be expected to output, albeit less, approximately the same amount of light. Thus, using process 500, computer 16 may avoid making multiple inaccurate reports. Of course, while a brown-out condition is described, vehicle 12 may be used to determine a black-out condition too (e.g., wherein the computer 16 knows that a series of lamps are adjacent the roadway R, that ambient light is relatively low, but the series of lamps are all OFF).

Other examples also exist. For example, using vision system 46, computer 16 may capture an image of lamps determined to be in the degraded or failure state. This image may be transmitted with any report to the backend system 14—e.g., for further evaluation by backend server 70 or even a human user of the server 70.

According to another example, server 70 may account per vehicle 12 for the quantity of reported (or accurately reported) lamps 20 in the degraded and/or failure states. According to one non-limiting example, server 70 may provide a monetary reward for degraded and/or failure state reportings. Thus, a user may own the vehicle 12 and receive a reward for using the vehicle 12 to determine degradations or failures. Further, fleet owners particularly may benefit from use of off-duty taxi vehicles 12. For example, while waiting for a patron, an autonomous vehicle 12 may patrol a parking lot, garage, street, etc. determining the states of the lamps 20—e.g., until a time when the patron is ready for pick-up or the like.

According to another example, at least one vehicle 12 (e.g., using computer 16) in a vehicle platoon may determine by inference that at least one of the vehicles in the platoon is experiencing a malfunction of light-sensitive sensing system—i.e., that the respective sensing system 18 (or other system) onboard the respective vehicle is in a malfunction state (rather than a lamp 20 being in a degraded state). Consider for example, a platoon of vehicles wherein at least one of the vehicles repeatedly communicates (to a leader vehicle 12 of the platoon) a degraded state as it passes under each of a plurality of street lamps 20, wherein the remainder of the vehicles in the platoon correspondingly communicate (to leader vehicle 12) an un-degraded state of each of the respective plurality of lamps 20. In such instances, the computer 16 of the leader vehicle may infer that the communications received from the particular vehicle is outlier data (and ignore it). Further, one or more of the vehicles in the platoon (including the malfunctioning vehicle itself) could send a diagnostic report indicating a request for service of its sensing system by an authorized vehicle technician.

According to another example, computer 16 may determine (e.g., by inference) that a pole supporting an infrastructure lamp 20 may be bent or damaged. For example, while vehicle 12 moves beneath a series of lamps 20, as discussed above—maintaining a relatively constant distance therefrom—a shift in the light input response (e.g., across the array 32) may indicate one of the lamp poles is not fully upright, is askew, etc. In response to this determination, vehicle 12 may include this information in the report sent to the backend system 14.

As discussed above, according to one example, the array 32 of vehicle 12 serves a dual-purpose. In one example, the array of PV cells 32 is used to power the fully electric, hybrid electric, or solar-electric vehicle during the daytime; and at night-time, the array 32 is used to report the states of infrastructure lamps 20.

Thus, there has been described an infrastructure status reporting system that includes a backend system and a vehicle computer coupled to a sensing system carried by a vehicle. The computer may be programmed to receive a light input from the sensing system, and based on the light input, determine that an infrastructure lamp is in one of a normal state, a degraded state, or a failure state. The computer also may transmit a report to the backend system based on the determination.

In general, the computing systems and/or devices described may employ any of a number of computer operating systems, including, but by no means limited to, versions and/or varieties of the Ford SYNC® application, AppLink/Smart Device Link middleware, the Microsoft® Automotive operating system, the Microsoft Windows® operating system, the Unix operating system (e.g., the Solaris® operating system distributed by Oracle Corporation of Redwood Shores, Calif.), the AIX UNIX operating system distributed by International Business Machines of Armonk, N.Y., the Linux operating system, the Mac OSX and iOS operating systems distributed by Apple Inc. of Cupertino, Calif., the BlackBerry OS distributed by Blackberry, Ltd. of Waterloo, Canada, and the Android operating system developed by Google, Inc. and the Open Handset Alliance, or the QNX® CAR Platform for Infotainment offered by QNX Software Systems. Examples of computing devices include, without limitation, an on-board vehicle computer, a computer workstation, a server, a desktop, notebook, laptop, or handheld computer, or some other computing system and/or device.

Computing devices generally include computer-executable instructions, where the instructions may be executable by one or more computing devices such as those listed above. Computer-executable instructions may be compiled or interpreted from computer programs created using a variety of programming languages and/or technologies, including, without limitation, and either alone or in combination, Java™, C, C++, Visual Basic, Java Script, Perl, etc. Some of these applications may be compiled and executed on a virtual machine, such as the Java Virtual Machine, the Dalvik virtual machine, or the like. In general, a processor (e.g., a microprocessor) receives instructions, e.g., from a memory, a computer-readable medium, etc., and executes these instructions, thereby performing one or more processes, including one or more of the processes described herein. Such instructions and other data may be stored and transmitted using a variety of computer-readable media.

A computer-readable medium (also referred to as a processor-readable medium) includes any non-transitory (e.g., tangible) medium that participates in providing data (e.g., instructions) that may be read by a computer (e.g., by a processor of a computer). Such a medium may take many forms, including, but not limited to, non-volatile media and volatile media. Non-volatile media may include, for example, optical or magnetic disks and other persistent memory. Volatile media may include, for example, dynamic random access memory (DRAM), which typically constitutes a main memory. Such instructions may be transmitted by one or more transmission media, including coaxial cables, copper wire and fiber optics, including the wires that comprise a system bus coupled to a processor of a computer. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, an EPROM, a FLASH-EEPROM, any other memory chip or cartridge, or any other medium from which a computer can read.

Databases, data repositories or other data stores described herein may include various kinds of mechanisms for storing, accessing, and retrieving various kinds of data, including a hierarchical database, a set of files in a file system, an application database in a proprietary format, a relational database management system (RDBMS), etc. Each such data store is generally included within a computing device employing a computer operating system such as one of those mentioned above, and are accessed via a network in any one or more of a variety of manners. A file system may be accessible from a computer operating system, and may include files stored in various formats. An RDBMS generally employs the Structured Query Language (SQL) in addition to a language for creating, storing, editing, and executing stored procedures, such as the PL/SQL language mentioned above.

In some examples, system elements may be implemented as computer-readable instructions (e.g., software) on one or more computing devices (e.g., servers, personal computers, etc.), stored on computer readable media associated therewith (e.g., disks, memories, etc.). A computer program product may comprise such instructions stored on computer readable media for carrying out the functions described herein.

The processor is implemented via circuits, chips, or other electronic component and may include one or more microcontrollers, one or more field programmable gate arrays (FPGAs), one or more application specific circuits ASICs), one or more digital signal processors (DSPs), one or more customer integrated circuits, etc. The processor may be programmed to process the sensor data. Processing the data may include processing the video feed or other data stream captured by the sensors to determine the roadway lane of the host vehicle and the presence of any target vehicles. As described below, the processor instructs vehicle components to actuate in accordance with the sensor data. The processor may be incorporated into a controller, e.g., an autonomous mode controller.

The memory (or data storage device) is implemented via circuits, chips or other electronic components and can include one or more of read only memory (ROM), random access memory (RAM), flash memory, electrically programmable memory (EPROM), electrically programmable and erasable memory (EEPROM), embedded MultiMediaCard (eMMC), a hard drive, or any volatile or non-volatile media etc. The memory may store data collected from sensors.

The disclosure has been described in an illustrative manner, and it is to be understood that the terminology which has been used is intended to be in the nature of words of description rather than of limitation. Many modifications and variations of the present disclosure are possible in light of the above teachings, and the disclosure may be practiced otherwise than as specifically described.

The invention claimed is:

1. A computer, comprising:
    at least one processor and memory storing instructions executable by the at least one processor, the instructions comprising, to:
        receive a light input from an array of photovoltaic cells carried by a vehicle;
        based on the light input, determine that an infrastructure lamp is in a degraded state or a failure state; and
        transmit a report to a backend system based on the determination,
        wherein each of the photovoltaic cells is an electrical device that converts light energy into electricity according to a photovoltaic effect to at least partially power to the vehicle.

2. The computer of claim 1, wherein the array is located on a roof of the vehicle.

3. The computer of claim 1, wherein the array is coupled to a vehicle power bus to provide electrical power to the vehicle.

4. The computer of claim 1, wherein the computer further is programmed to: determine that the lamp is in the degraded state based on an intensity of the light input being less than a first threshold and greater than a second threshold; and determine that the lamp is in the failure state based on an intensity of the light input being less than the second threshold.

5. The computer of claim 1, wherein the computer further is programmed to instruct the vehicle to slow down prior to receiving the light input from the lamp.

6. The computer of claim 1, wherein the lamp is positioned and oriented to illuminate a path or roadway for moving vehicles, positioned and oriented to illuminate a pedestrian walkway or sidewalk, or positioned and oriented to illuminate a vehicle parking region.

7. The computer of claim 1, wherein the report includes an identifier of the lamp and an indication of the degraded or failure state.

8. The computer of claim 1, wherein the report includes location data associated with the lamp.

9. The computer of claim 1, wherein the computer further is programmed to receive an identifier wirelessly from the lamp.

10. The computer of claim 1, wherein the computer further is programmed to receive wirelessly: data from the lamp that is associated with a height (h1) of a light source of the lamp relative to a roadway surface, data from the lamp associated with a beam pattern of the light source, or a combination thereof.

11. The computer of claim 1, wherein the computer further is programmed to receive wirelessly light inputs associated with the lamp from one or more additional vehicles, wherein the vehicle and the one or more additional vehicles are part of a platoon of vehicles.

12. The computer of claim 11, wherein the computer further is programmed to determine whether the lamp is in a normal state, the degraded state, or a failure state based on the light inputs associated with each of the vehicles in the platoon.

13. The computer of claim 1, wherein the computer further is programmed to determine a local brown-out or black-out condition based on the light inputs from a series of lamps spaced from one another along a roadway.

14. The computer of claim 1, wherein the computer further is programmed to determine the degraded state or the failure state of at least one of a series of lamps based on the light inputs of the at least one lamp in the series compared with the light inputs of the series of lamps.

15. The computer of claim 1, wherein the vehicle includes one of a passenger vehicle, truck, freight vehicle, sports utility vehicle, recreational vehicle, bus, train, marine vessel, aircraft, or drone.

16. A system, comprising: the computer of claim 1, and the array of photovoltaic cells electrically coupled to the computer.

17. A system, comprising:
a plurality of vehicles each having an array of photovoltaic cells, wherein each of the photovoltaic cells is an electrical device that converts light energy into electricity according to a photovoltaic effect to at least partially power to each of the respective plurality of vehicles; and
a server computer, programmed to:
receive messages from the plurality of vehicles that includes location data and a status of an infrastructure lamp; and
based on the messages, determine that the infrastructure lamp is in one of a normal state, a degraded state, or a failure state.

18. The system of claim 17, wherein the server computer further is programmed to determine a confidence level associated with the determined normal, degraded, or failure state.

19. The system of claim 17, wherein the server computer further is programmed to update localization data based on the messages.

20. A method, comprising:
receiving a light input from an array of photovoltaic cells carried by a vehicle, wherein each of the photovoltaic cells is an electrical device that converts light energy into electricity according to a photovoltaic effect to at least partially power to the vehicle;
based on the light input, determining that an infrastructure lamp is in a degraded state or a failure state; and
transmitting a report to a backend system based on the determination.

\* \* \* \* \*